United States Patent [19]

Tada

[11] Patent Number: 4,807,229
[45] Date of Patent: Feb. 21, 1989

[54] SEMICONDUCTOR DEVICE TESTER

[75] Inventor: Tetsuo Tada, Itami, Japan

[73] Assignee: Mitsubishi Denki Kabushiki Kaisha, Tokyo, Japan

[21] Appl. No.: 50,549

[22] Filed: May 18, 1987

[30] Foreign Application Priority Data

May 20, 1986 [JP] Japan .................................. 61-115008

[51] Int. Cl.[4] ............................................ G01R 31/28
[52] U.S. Cl. ...................................................... 371/27
[58] Field of Search ................... 371/27, 25; 324/73 R, 324/73 AT

[56] References Cited

U.S. PATENT DOCUMENTS

| 4,451,918 | 5/1984 | Gillette | 371/27 |
| 4,639,919 | 1/1987 | Chang | 371/27 |
| 4,652,814 | 3/1987 | Groves | 371/27 X |
| 4,736,375 | 4/1988 | Tannhauser | 371/27 |

OTHER PUBLICATIONS

Trillium Tester Product Specification, Rev. 1, Jan. 1986, pp. 7, 12 and 13.

Primary Examiner—Joseph Ruggiero
Assistant Examiner—Robert W. Beausoliel
Attorney, Agent, or Firm—Saidman, Sterne, Kessler & Goldstein

[57] ABSTRACT

A semiconductor device tester comprises a random data generator, an algorithmic data generator, and a serial data generator. The test data pattern of the data generators are selected and combined to produce test pattern data actually applied to a device under test. At least part of the test data pattern from the algorithmic data generator are applied to one of the random data generator and the serial data generator, which, responsive thereto, produces the random test pattern data or the serial test pattern data.

6 Claims, 10 Drawing Sheets

FIG.2

| | 1 | 2 | 3 | 4 | 5 | 6 | 7 | -------- N | →X |
|---|---|---|---|---|---|---|---|---|---|
| 0 | 0 | 0 | 1 | 0 | 0 | 0 | 0 | | |
| 1 | 1 | 0 | 1 | 0 | 0 | 0 | 1 | | |
| 2 | 1 | 0 | 1 | 0 | 0 | 1 | 0 | | |
| 3 | 0 | 0 | 1 | 0 | 0 | 1 | 1 | | |
| 4 | 1 | 0 | 1 | 0 | 1 | 0 | 0 | | |
| 5 | 1 | 0 | 1 | 0 | 1 | 0 | 1 | | |
| 6 | 1 | 0 | 1 | 0 | 1 | 1 | 0 | | |
| 7 | 0 | 0 | 1 | 0 | 1 | 1 | 1 | | |
| 8 | 1 | 1 | 0 | 1 | 0 | 0 | 0 | | |
| 9 | 0 | 1 | 0 | 1 | 0 | 0 | 1 | | |
| 10 | 1 | 1 | 0 | 1 | 0 | 1 | 0 | | |
| 11 | 1 | 1 | 0 | 1 | 0 | 1 | 1 | | |
| 12 | 0 | 1 | 0 | 1 | 1 | 0 | 0 | | |
| 13 | 0 | 1 | 0 | 1 | 1 | 0 | 1 | | |
| 14 | 1 | 1 | 0 | 1 | 1 | 1 | 0 | | |
| 15 | 0 | 1 | 0 | 1 | 1 | 1 | 1 | | |
| 16 | 1 | 0 | 1 | 0 | 0 | 0 | 0 | | |
| ⋮ | ⋮ | ⋮ | ⋮ | ⋮ | ⋮ | ⋮ | ⋮ | | |
| M-1 | 1 | 0 | 1 | 1 | 1 | 0 | 1 | | |
| M | 0 | 0 | 1 | 1 | 1 | 1 | 1 | | |

| | 1 | 2 | 3 | 4 | 5 | 6 | 7 | -------- N | → X |
|---|---|---|---|---|---|---|---|---|---|
| 0 | 0 | 0 | 1 | 0 | 0 | 0 | 0 | | |
| 1 | 1 | 0 | 1 | 0 | 0 | 0 | 1 | | |
| 2 | 1 | 0 | 1 | 0 | 0 | 1 | 0 | | |
| 3 | 0 | 0 | 1 | 0 | 0 | 1 | 1 | | |
| 4 | 1 | 0 | 1 | 0 | 0 | 0 | 0 | | |
| 5 | 1 | 0 | 1 | 0 | 0 | 0 | 1 | | |
| 6 | 1 | 0 | 1 | 0 | 0 | 1 | 0 | | |
| 7 | 0 | 0 | 1 | 1 | 0 | 1 | 1 | | |
| 8 | 1 | 1 | 0 | 0 | 0 | 0 | 0 | | |
| 9 | 0 | 1 | 0 | 0 | 0 | 0 | 1 | | |
| 10 | 1 | 1 | 0 | 1 | 0 | 1 | 0 | | |
| 11 | 1 | 1 | 0 | 0 | 0 | 1 | 1 | | |
| 12 | 0 | 1 | 0 | 0 | 0 | 0 | 0 | | |
| 13 | 0 | 1 | 0 | 0 | 0 | 0 | 1 | | |
| 14 | 1 | 1 | 0 | 1 | 0 | 1 | 0 | | |
| 15 | 0 | 1 | 0 | 1 | 0 | 1 | 1 | | |
| 16 | 1 | 0 | 1 | 0 | 0 | 0 | 0 | | |
| 17 | 0 | 0 | 1 | 1 | 0 | 0 | 1 | | |
| 18 | 0 | 0 | 1 | 0 | 0 | 1 | 0 | | |
| 19 | 1 | 0 | 1 | 0 | 0 | 1 | 1 | | |
| : | : | : | : | : | : | : | : | | |
| 60 | 1 | 0 | 1 | 1 | 0 | 0 | 0 | | |
| 61 | 0 | 0 | 1 | 1 | 0 | 0 | 1 | | |
| 62 | 1 | 0 | 1 | 1 | 0 | 1 | 0 | | |
| 63 | 0 | 0 | 1 | 1 | 0 | 1 | 1 | | |
| : | : | : | : | : | : | : | : | | |
| M | 0 | 0 | 1 | 0 | -- | -- | -- | -- | |

|  | 1 | 2 | 3 | 4 | 5 | 6 |
|---|---|---|---|---|---|---|
| 0 | 0 | 0 | 0 | 0 | 0 | 0 |
| 1 | 1 | 0 | 0 | 0 | 0 | 1 |
| 2 | 1 | 0 | 0 | 0 | 1 | 0 |
| 3 | 0 | 0 | 0 | 0 | 1 | 1 |
| 4 | 1 | 0 | 0 | 1 | 0 | 0 |
| 5 | 1 | 0 | 0 | 1 | 0 | 1 |
| 6 | 1 | 0 | 0 | 1 | 1 | 0 |
| 7 | 0 | 0 | 0 | 1 | 1 | 1 |
| 8 | 1 | 1 | 1 | 0 | 0 | 0 |
| 9 | 0 | 1 | 1 | 0 | 0 | 1 |
| 10 | 1 | 1 | 1 | 0 | 1 | 0 |
| 11 | 1 | 1 | 1 | 0 | 1 | 1 |
| 12 | 0 | 1 | 1 | 1 | 0 | 0 |
| 13 | 0 | 1 | 1 | 1 | 0 | 1 |
| 14 | 1 | 1 | 1 | 1 | 1 | 0 |
| 15 | 0 | 1 | 1 | 1 | 1 | 1 |
| 16 | 1 | 0 | 0 | 0 | 0 | 0 |
| ⋮ | ⋮ | ⋮ | ⋮ | ⋮ | ⋮ | ⋮ |
| M-1 | 1 | 0 | 1 | 1 | 0 | 1 |
| M | 0 | 0 | 1 | 1 | 1 | 1 |

FIG.12

|  | 1 | 2 | 3 | 4 | 5 | 6 |
|---|---|---|---|---|---|---|
| 0 | 0 | 0 | 0 | 0 | 0 | 0 |
| 1 | 1 | 0 | 0 | 0 | 0 | 1 |
| 2 | 1 | 0 | 0 | 0 | 1 | 0 |
| 3 | 0 | 0 | 0 | 0 | 1 | 1 |
| 4 | 1 | 0 | 0 | 1 | 0 | 0 |
| 5 | 1 | 0 | 0 | 1 | 0 | 1 |
| 6 | 1 | 0 | 0 | 1 | 1 | 0 |
| 7 | 0 | 0 | 1 | 1 | 1 | 1 |
| 8 | 1 | 1 | 0 | 0 | 0 | 0 |
| 9 | 0 | 1 | 0 | 0 | 0 | 1 |
| 10 | 1 | 1 | 1 | 0 | 1 | 0 |
| 11 | 1 | 1 | 0 | 0 | 1 | 1 |
| 12 | 0 | 1 | 0 | 1 | 0 | 0 |
| 13 | 0 | 1 | 0 | 1 | 0 | 1 |
| 14 | 1 | 1 | 1 | 1 | 1 | 0 |
| 15 | 0 | 1 | 1 | 1 | 1 | 1 |
| 16 | 1 | 0 | 0 | 0 | 0 | 0 |
| 17 | 0 | 0 | 1 |  |  |  |
| 18 | 0 | 0 | 0 |  |  |  |
| 19 | 1 | 0 | 0 |  |  |  |
| ⋮ | ⋮ | ⋮ | ⋮ |  |  |  |
| 60 | 1 | 0 | 1 |  |  |  |
| 61 | 0 | 0 | 1 |  |  |  |
| 62 | 1 | 0 | 1 |  |  |  |
| 63 | 0 | 0 | 1 |  |  |  |
| ⋮ | ⋮ | ⋮ | ⋮ |  |  |  |
| M | 0 | 0 | 0 |  |  |  |

SEMICONDUCTOR DEVICE TESTER

BACKGROUND OF THE INVENTION

The present invention relates to a semiconductor device tester generating various test patterns.

FIG. 1 shows a conventional semiconductor device tester, which comprises a random pattern data generator (hereinafter referred to as RPG) 1 for generating and storing test patterns which varies randomly, an algorithmic pattern data generator (hereinafter referred to as ALPG) 2 for generating test pattern data by arithmetic and logic operations, e.g., by continuous counting, a serial pattern data generator (hereinafter referred to as SPG) 3 for generating and storing serial test pattern data, a first switching unit (hereinafter referred to as AMUX) 4 for selecting, in accordance with a switch control signal A, the test pattern data from the ALPG 2 or the test pattern data from the SPG 3, a second switching unit (hereinafter referred to as BMUX) 5 for selecting, in accordance with the switch control signal B, the test pattern data from the RPG 1 or the test pattern data from the AMUX 4. The outputs of the BMUX 5 are connected to channels P which are connected to the terminals or pins of a semiconductor device under test (hereinafter referred to as DUT), not shown, and through which the test pattern data are supplied to the pins of the DUT.

An example of test pattern data to be applied to the pins of the DUT is shown in FIG. 2, in which the numbers x in the horizontal direction are the respective numbers of the pins of the DUT. The largest number X is 256, for example. The numbers y in the vertical direction are the respective "cycle numbers" representing progress of time, and normally correspond to the respective numbers of the test pattern data generated by the RPG 1. The largest number Y is 1048576 ($=1024\times1024=1$ Mbits), for example. The number X of pins of the DUT corresponds to the number of the channels P and the pins are respectively connected to the channels. Therefore the references P1 to PN are sometimes used for the pins as well as the channels.

The combinations of 0,1 of the first pin P1 ($x=1$) of the DUT appear randomly with time. This means that the data (random test pattern data) on the first channel P1 are derived from the RPG 1. In regard to the second and third pins P2 and P3 ($x=2$ and $x=3$), 8 cycles of 0's and 1's appear in alternation. These data (serial test data pattern) are derived from the SPG3. The data on the fourth to seventh pins P4 to P7 ($x=4$ to $x=7$) of the DUT are identical to successive outputs of a 4-bit counter counting the number of the cycles (y), that is the value of the data is successively incremented by 1. At each 16th cycle (e.g., at $y=15$), all the bits on the pins P4 to P7 are 1 and the value of the data returns to "0000" at the immediately succeeding cycle. Thus in the example of FIG. 2, the data on the pins P4 to P7 are derived from the ALPG 3. It takes 16 cycles for all possible permutations of the four bits for the four pins P4 to P7 to appear in turn.

Another example of test pattern data to be applied to the pins of the DUT is shown in FIG. 3, in which data on the first to third pins P1 to P3 are identical to those of FIG. 2. But the data on the fourth pin P4 are different. As will been seen, the data on the fourth pin P4 can be considered as an output of a counter if combinations each consisting of four successive bits are taken as units, and the figures of the larger cycle numbers are seen as the lower bits. For instance, the 0th to 3rd cycle form "0000", while the 4th to 7th cycles form "0001", and the 8th to 11th cycles form "0010", and so on. For all possible permutations of the four successive cycles to appear in turn, it takes 64 cycles. In other words, a sequence of such data takes 64 cycles to complete. To provide this sequence of data, the RPG1 or the SPG3 must store a very long series of data. This requires a very large amount of work during preparation of the test pattern.

SUMMARY OF THE INVENTION

An object of the invention is to reduce the length of test pattern data, thereby to reduce the workload for preparing the test pattern.

According to the invention, there is provided a semiconductor device tester comprising a first data generator for generating first test pattern data varying randomly, a second data generator for generating second test pattern data defined algorithmically, a third data generator for generating third test pattern data being serial, and means for selecting and combining the test pattern data of the first, second and third data generators to output a fourth test pattern data, said selecting and combining means applying at least part of the test pattern data from the second data generator to one of the first data generator and the third data generator, said one of the first data generator and the third data generator being responsive to said at least some of the test pattern data from the second data generator for producing the first test pattern data or the third test pattern data.

BRIEF DESCRIPTION OF THE DRAWINGS

In the accompanying drawings:

FIGS. 2 and 3 show examples of test pattern data which are desired,

DESCRIPTION OF THE PREFERRED EMBODIMENTS

Figure 1:
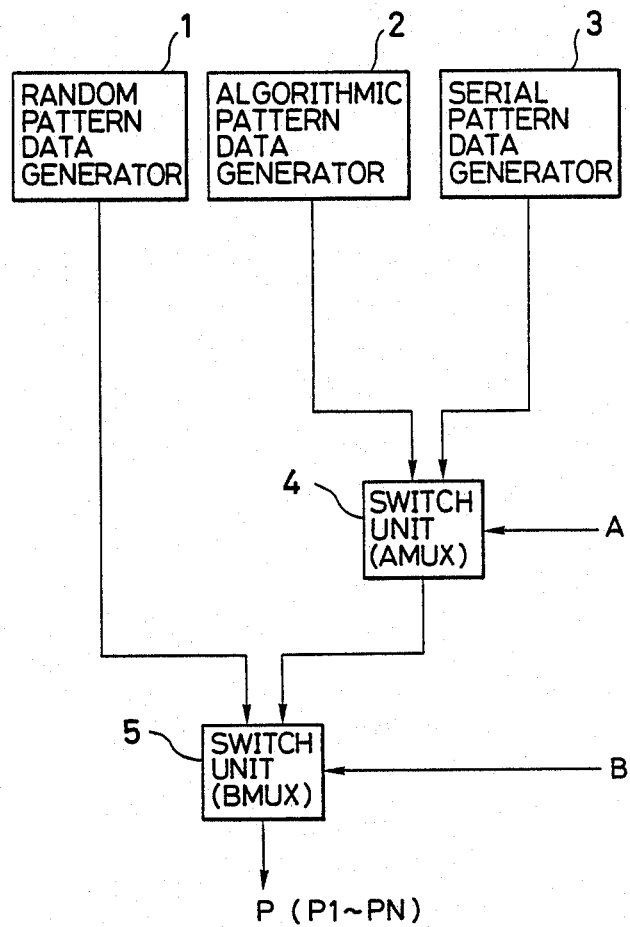
FIG. 1 is a block diagram showing a conventional semiconductor device tester.
Figure 4:
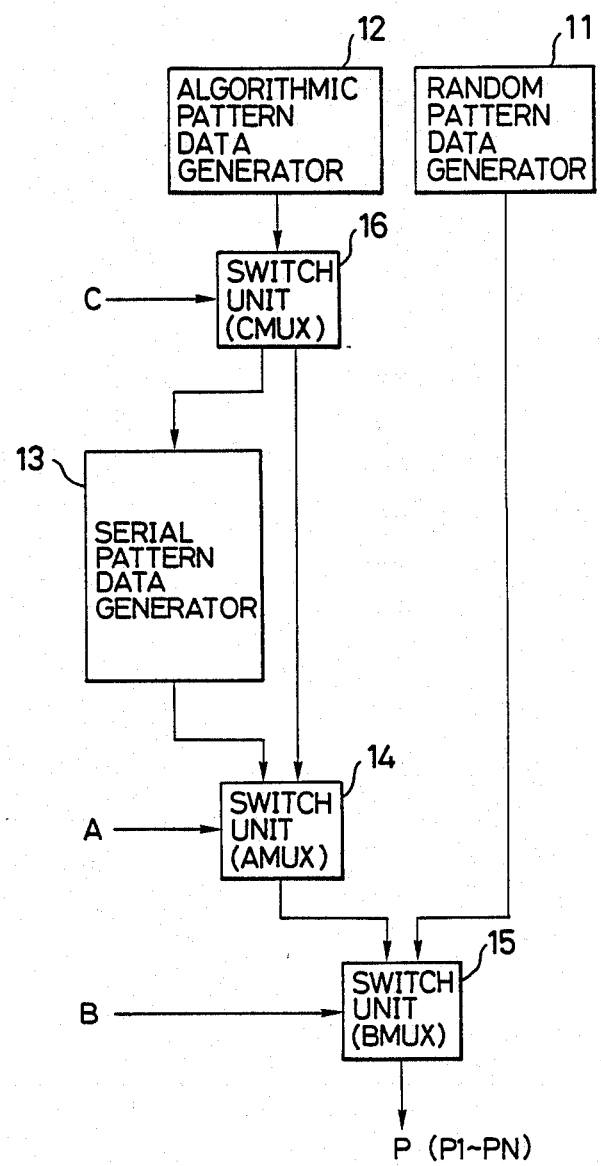
FIGS. 4 and 5 are block diagrams showing embodiments of the invention.

A semiconductor device tester of an embodiment of the invention will now be described with reference to FIG. 4. The tester of the illustrated embodiment comprises a random pattern data generator (hereinafter referred to as RPG) 11 for generating and storing test patterns which varies randomly, an algorithmic pattern data generator (hereinafter referred to as ALPG) 12 for generating test pattern data by arithmetic and logic operations, e.g., by continuous counting, a serial pattern data generator (hereinafter referred to as SPG) 13 for generating and storing serial test pattern data, a first switching unit (hereinafter referred to as AMUX) 14 for selecting, in accordance with a switch control signal A, the test pattern data from the ALPG 12 or the test pattern data from the SPG 13, a second switching unit (hereinafter referred to as BMUX) 15 for selecting, in accordance with the switch control signal B, the test pattern data from the RPG 11 or the test pattern data from the AMUX 14, which respectively correspond to the members 11, 12, 13, 14 and 15 of FIG. 4. The outputs of the BMUX 15 are connected to channels P which are connected to the pins of the semiconductor device under test (DUT), not shown and through which the test pattern data are supplied to the pins of the DUT.

There is further provided a third switch unit (hereinafter referred to as CMUX) 16 which selectively delivers, in accordance with a third switch control signal C, the test pattern data from the ALPG 12 to the SPG 13 or directly to the AMUX 14.

Responsive to the third switch control signal C, the CMUX 16 inputs the test pattern data from the ALPG 12 to the SPG 13, which converts the test pattern data from the ALPG 12 into serial data. For instance, the four-bit parallel data shown in FIG. 2 at $x=4$ to $x=7$ are input to the SPG 13 and are converted to a single series of bits shown in FIG. 3 at $x=4$ and stored there. As a result, every four bits extending horizontally and ranging from $x=4$ to $x=7$ in FIG. 2 at the respective cycle are made to extend vertically i.e. in the direction of the cycle numbers (progress of time). The function can be regarded as a parallel-to-serial conversion.

The test pattern data stored in the SPG 13 are passed through the AMUX 14, responsive to the first switch control signal A, and are then passed through the BMUX15, responsive to the second switch control signal B, so that the data at $x=4$ in FIG. 3 are supplied to the fourth pin P4 of the DUT.

The data on the first pin P1 ($x=1$) can be supplied from the RPG 11 by control over the BMUX 15, while data on the second and third pins P2 and P3 ($x=2$ and $x=3$) can be supplied from the SPG 13, and the data on the fifth to seventh pins P5 to P7 ($x=5$ $x=7$) can be supplied from the ALPG 12. The selective application of the test pattern data can be achieved by control of the AMUX 14, BMUX15 and CMUX 16.

Thus with the embodiment described above, the test pattern data form the RPG11, ALPG 12 and the SPG13 are "mixed" by control of the switch units 14, 15 and 16, and very long serial test pattern data can be readily generated, and can be applied to any desired pin of the DUT.

Figure 5:
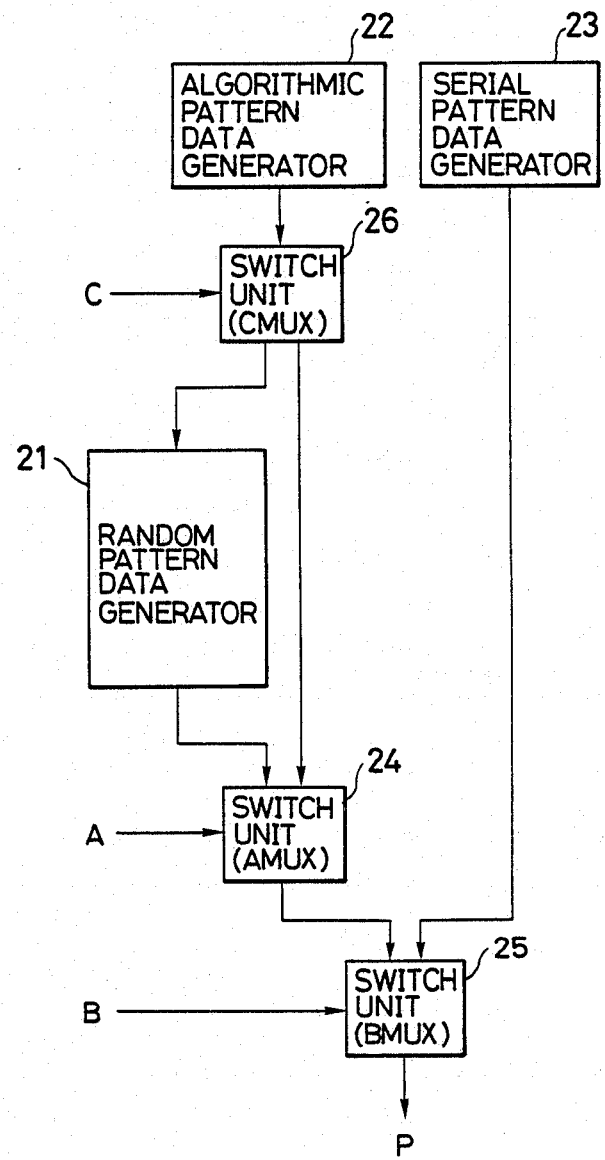

A second embodiment of the invention is shown in FIG. 5. In this embodiment, components 21 to 26 correspond to the components 11 to 16 in FIG. 4. But the connection of the components is different. That is a random data pattern generator 21 is connected to receive and store the test pattern data from an ALPG 22 via a third switch unit 26. A switch unit 24 selects either the output of the RGP 21 or the outputs of the ALPG 22. A switch unit 25 selects either the output of the switch unit 24 or the output of the SPG 23.

Figure 6:
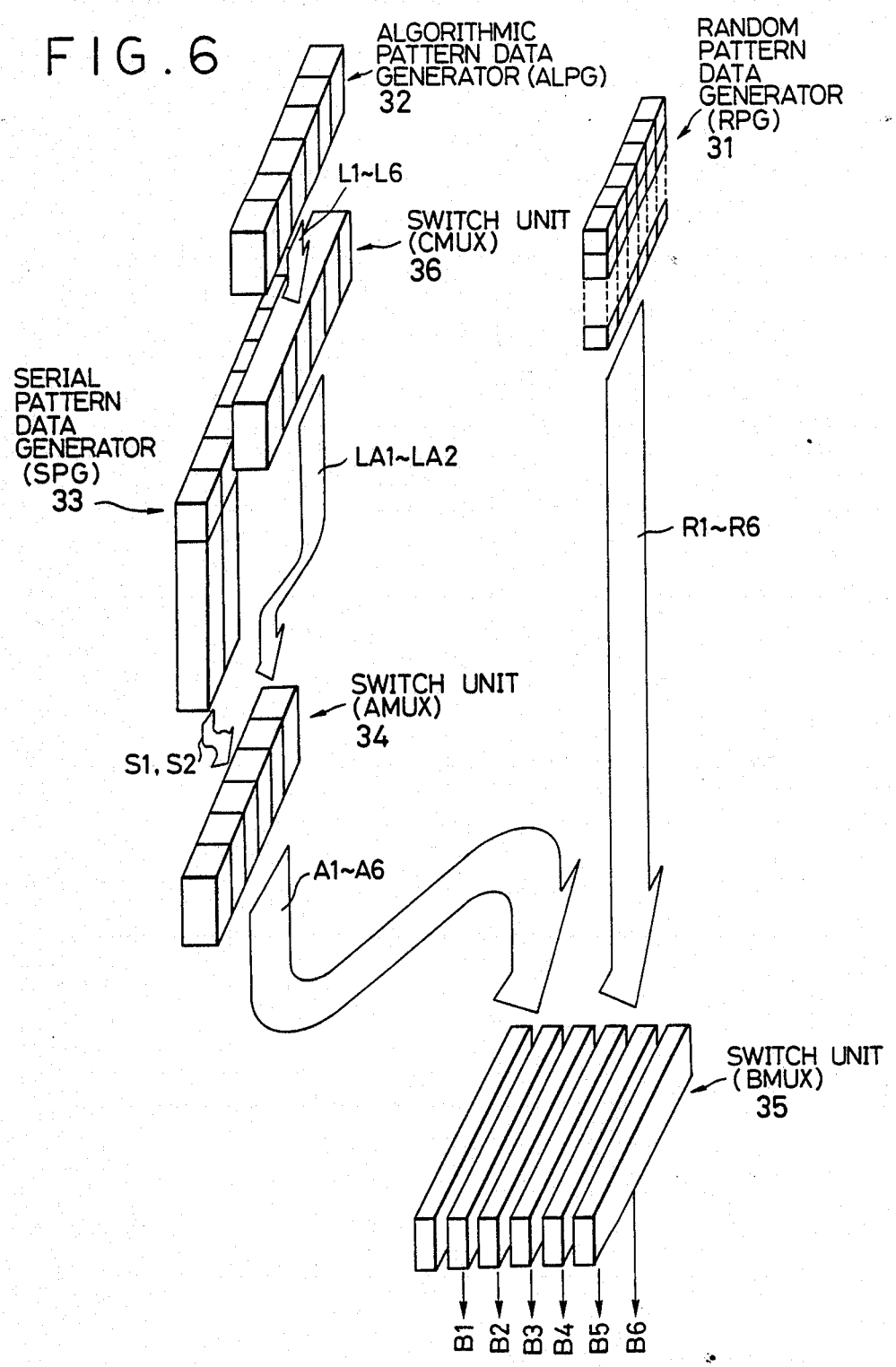
FIG. 6 is a schematic diagram showing a further embodiment of the invention.

A further embodiment of the invention is shown in FIG. 6. In this embodiment, it is assumed that the number of the pins of the DUT is six (6) for the sake of simplicity of description and illustrated.

An RPG 31 is shown to comprise stack of k registers each being 6-bit wide. It cyclically produces the contents of the registers. The test pattern data from the RPG 31 therefore have the width of 6 bits and the length of k bits. The outputs of the RPG 31 are denoted by R1 to R6. The value of k is 1048576, for example.

An ALPG 32 produces algorithmically defined test pattern data through its six output pins L1 to L6.

Figure 7:
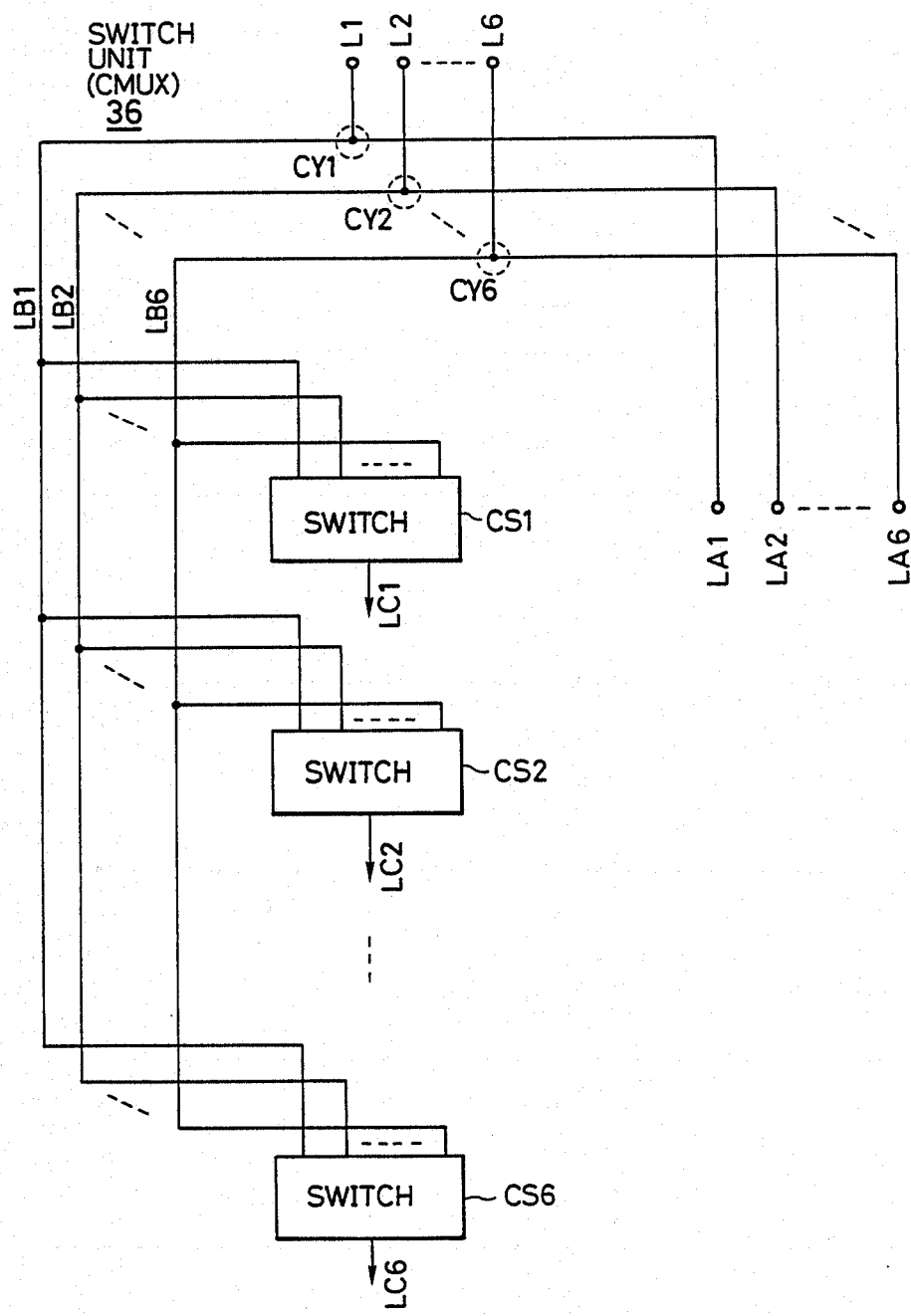
FIGS. 7 to 10 are schematic diagrams showing components of the embodiment of FIG. 6, and FIGS. 11 and 12 show examples of test pattern data produced by the embodiment of FIG. 6.

A switch unit 36, shown in FIG. 7, comprises branch connections CY1 to CY6 branching the output lines L1 to L6 in two ways. A first set of branch lines LA1 to LA6 are directly connected to a switch unit 34, which will later be described. A second set of branch lines LB1 to LB6 are connected to selection switches CS1 to CS6. Each of the selection switches CS1 to CS6 selects one of the inputs LB1 to LB6 and outputs the selected one of the inputs. The outputs of the selection switches CS1 to CS6, denoted by LC1 to LC6, are input to an SPG 33.

Figure 8:
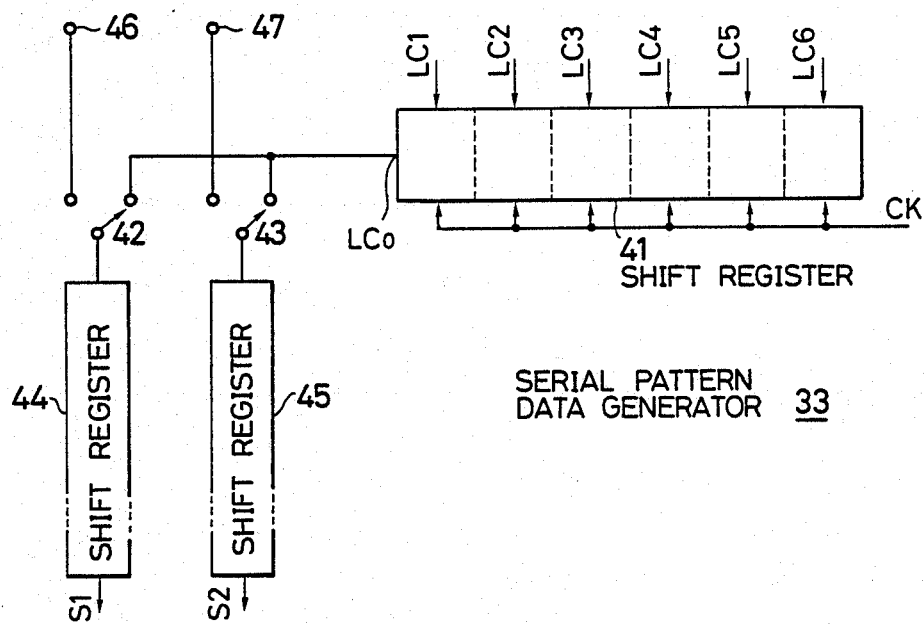

As shown in FIG. 8, the SPG 33 comprises, a parallel-to-serial converter 41 in the form of a shift register having six stages whose inputs are respectively connected to receive the outputs LC1 to LC6. In synchronism with a clock CK, the shift register shifts the data leftward (as seen in the figure) to an output end LCo. The serial outputs at LCo are supplied through switches 42 and 43 to respective shift registers 44 and 45. Each of the switches 42 and 43 selects the output of the shift register 41 or data through a terminal 46 or 47, which is connected to a source of serial data, not shown.

Each of the shift registers 44 and 45 has q (e.g., 256) stages.

It can be so arranged that part only of the contents of the shift register 41 are output. For instance, the contents input through LC1 to LC4 only are output in succession and the contents in the stages corresponding to LC5 and LC6 are disregarded. If it is so arranged that the data on the four lines LC1 or LC4 are values of a counter which is incremented successively, outputting the contents of the stages corresponding to LC1 to LC4 will result in a sequence of bits as shown at the column of $x=4$ in FIG. 3, or at the column of $x=3$ in FIG. 12 which will later be described.

Figure 9:
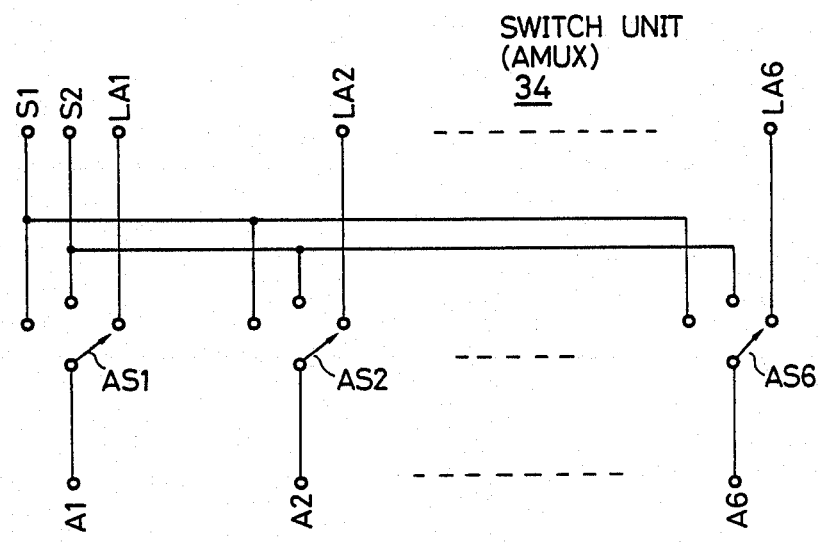
Figure 10:
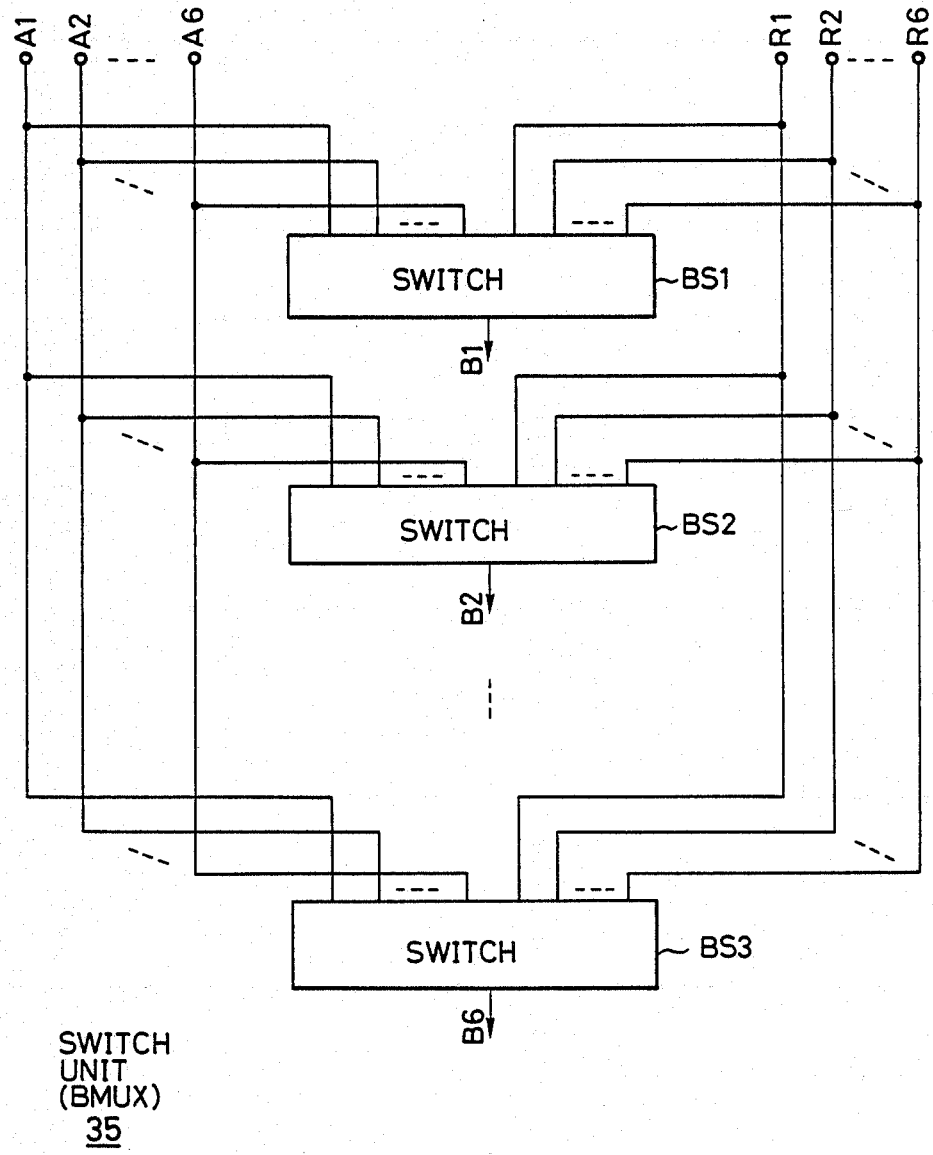

As shown in FIG. 9, the switch unit 34 comprises six switches AS1 to AS6, each of which selects the corresponding one of the lines LA1 to LA6, the line S1 or the line S2. The switches AS1 to AS6 are controlled individually and their outputs A1 to A6 are supplied to a switch unit 35.

The switch unit 35 comprises six switches BS1 to BS6 each of which selects one of the lines A1 to A6 and LA1 to LA6. The switches BS1 to BS6 are controlled individually and their outputs P1 to P6 (B1 to B6) are connected to the pins P1 to P6 of the DUT.

By selecting and combining the output in the RPG 31, ALPG 32, and SPG 33, by properly controlling the switch units 34 to 36, a variety of the test pattern data can be applied to the pins of the DUT.

For instance the test pattern data shown in FIG. 11 can be obtained if the switch units 34 to 36 are so controlled that the data from the RPG 31 are transmitted through the switch unit 35 to appear at the pin P1, the contents of the shift register 44 or 45 of the SPG 3, as originally supplied through the terminal 46 or 47 from the source of the data not shown are transmitted through the switch units 34 and 35 to appear at the pin P2, and the data of the four bit counter increment value from the ALPG 32 are transmitted through the switch units 36, 34 and 35 to appear at the pins P3 to P6.

To obtain the test pattern data shown in FIG. 12, the data which should appear at the pins P1, P2 and P4 to P6 are routed in a manner similar to those in FIG. 11. to obtain the data on the pin P3, the outputs of the ALPG 32 are routed through the switch unit 36, the SPG 33, the switch unit 34 and the switch unit 35 to the pin P3. More particularly, the switches CS1 to CS4 respectively connect the lines LA1 to LA4 to the lines LC1 to LC4. The four-bit counter increment values, like the ones shown at the columns x=3 to x=6 in FIG. 11, are successively output through the lines L1 to L4. The counter values at the lines LC1 to LC4 are input to the shift register 41, which shifts the contents leftward. Thus the serial-to-parallel conversion is performed and the serial data as shown at the column x=3 in FIG. 12 are obtained. To output the four bits simultaneously input through the lines LC1 to LC4, four clock cycles are needed. Upon completion of successive output of the four bits, the next set of four bits are input to the shift register 41, and then serial-to-parallel conversion is performed. By control of the switchs 42 and 43, the outputs of the shift register 41 are input to one of the shift register 44 and 45 which is not used for the production of the data on the pin P2. For instance if the switch 42 is made to select the data through the terminal 46, the other switch 43 is made to select the output of the shift register 41, so that the data for the pin P2 are supplied through the shift register 44, while the output of the shift register 41 is routed through the switch 43 and the shift register 45 to the pin P3.

The switch unit 34 operates to select the input on the line S1 for the output on the line A2, the input on the line S2 for the output on the line A3, and the inputs LA2 to LA4 for the outputs A4 to A6.

The switch unit 35 operates to select the input on the lines A2 to A6 for the output on the lines B2 to B6, and the input on the line R1 for the output on the line Thus the 6-bit test pattern data as shown FIG. 12 are obtained on the outputs B1 to B6, which are applied to the pins P1 to P6.

In the embodiment of FIGS. 6 to 12, the switch unit 36 includes branch connections CY1 to CY6 for branching the inputs L1 to L6, so that one set of the outputs LA1 to LA6 are directly connected to the inputs L1 to L6. However, such branching can be made outside of the switch unit 36, so that the switch unit 34 directly receive the outputs of the ALPG 32.

Moreover, the switch units 34 and 35 may be incorporated into a single unit. For instance such a single unit may comprise six switches each of which receives the outputs of the RPG 31, the outputs of the ALPG 32 and the outputs of the SPG 33 and selectively outputs one of the inputs.

Furthermore, the arrangement of the switch units 34 to 36 can be changed in various ways. What is required for the accomplishment of the object of the invention is that there is an arrangement for selecting and combining the outputs of the RPG 31, the ALPG 32 and the SPG 33 and the arrangement for the selecting and combining applies at least part of the outputs of the ALPG 32 to one of the RPG 31 and the SPG 33 and the above-mentioned one of the RPG 31 and the SPG 33 is responsive to said at least some of the outputs of the ALPG 32 for producing the random test pattern data or the serial test pattern data.

What is claimed is:

1. A semiconductor device tester comprising
a first data generator for generating first test pattern data varying randomly,
a second data generator for generating second test pattern data defined algorithmically,
a third data generator for generating third test pattern data being serial, and
means for selecting and combining the test pattern data of the first, second and third data generators to output a fourth test pattern data,
said selecting and combining means appying at least part of the test pattern data from the second data generator to one of the first data generator and the third data generator,
said one of the first data generator and the third data generator being responsive to said at least some of the test pattern data from the second data generator for producing the first test pattern data or the third test pattern data.

2. A tester according to claim 1 wherein
said selecting and combining means comprises a first switch unit receiving the test pattern data from the second data generator and selectively producing said at least some of said test pattern data from the second data generator, and
said one of the first data generator and the third data generator means is connected to the first switch unit to receive said at least some of said test pattern data from the second data generator.

3. A tester according to claim 1 wherein said selecting and combining means comprises switch means receiving the test pattern data from the first, second and third data generators and selectively outputting the test pattern data which it receives.

4. A tester according to claim 3 wherein said switch means comprises a first switch unit receiving the test pattern data from the second data generator and the test pattern data from said one of the first and third data generators, and selectively outputting the test pattern data which it receives, and a second switch unit receiving the test pattern data from the first switch unit and the test pattern data from the second data generator and selectively outputting the test pattern data which it receives.

5. A tester according to claim 1 wherein said some of the test data pattern from the second data generator are parallel data and said one of the first and third data generators is the third data generator which comprises means for converting the parallel data into the serial data, which forms at least part of said serial test pattern data.

6. A tester according to claim 1 wherein said parallel data are counter increment data.

* * * * *